US012723327B2

(12) United States Patent
Ecker et al.

(10) Patent No.: US 12,723,327 B2
(45) Date of Patent: Sep. 1, 2026

(54) SYSTEM FOR MANUFACTURING A HIGH-QUALITY SEMICONDUCTOR SINGLE CRYSTAL, AND METHOD OF MANUFACTURING SAME

(71) Applicant: SiCrystal GmbH, Nuremberg (DE)

(72) Inventors: Bernhard Ecker, Nuremberg (DE); Ralf Müller, Nuremberg (DE); Philipp Schuh, Nuremberg (DE); Matthias Stockmeier, Nuremberg (DE); Michael Vogel, Nuremberg (DE)

(73) Assignee: SiCrystal GmbH, Nuremberg (DE)

( * ) Notice: Subject to any disclaimer, the term of this patent is extended or adjusted under 35 U.S.C. 154(b) by 278 days.

(21) Appl. No.: 18/425,532

(22) Filed: Jan. 29, 2024

(65) Prior Publication Data

US 2024/0263347 A1 Aug. 8, 2024

(30) Foreign Application Priority Data

Feb. 8, 2023 (EP) .................................... 23155497

(51) Int. Cl.
*C30B 23/06* (2006.01)
*C30B 29/36* (2006.01)

(52) U.S. Cl.
CPC ............ *C30B 23/066* (2013.01); *C30B 29/36* (2013.01)

(58) Field of Classification Search
CPC ........ C30B 23/02; C30B 23/066; C30B 29/36
See application file for complete search history.

(56) References Cited

U.S. PATENT DOCUMENTS

2003/0094132 A1 5/2003 Vodakov et al.
2021/0372003 A1 12/2021 Jang et al.

FOREIGN PATENT DOCUMENTS

CN 205313716 U 6/2016
CN 109280976 * 10/2018
JP 4199921 B2 * 12/2008 ............ C30B 29/36
JP 4597285 B2 * 12/2010
JP 2012-131679 A 7/2012
KR 10-2014-0041250 A 4/2014

OTHER PUBLICATIONS

Korean Office Action for KR Application No. 10-2024-0017598 dated Jun. 21, 2024, with translation, 10 pages.
Extended European Search Report of EP 23 15 5497.3, Jun. 30, 2023, 9 pages.

* cited by examiner

*Primary Examiner* — Robert M Kunemund

(74) *Attorney, Agent, or Firm* — Lewis Roca Rothgerber Christie LLP

(57) ABSTRACT

The present invention relates to systems and methods for growing bulk semiconductor single crystals, and more specifically, for growing a bulk semiconductor single crystals, such as silicon carbide, based on physical vapor transport. A sublimation system for growing at least one single crystal of a semiconductor material by means of a sublimation growing process comprises a crucible (102) having a longitudinal axis (120) and comprising a fixing means for at least one seed crystal (110) and at least one source material compartment (104) for containing a source material (108); a heating system being formed to generate an irregular temperature field around a circumference of the crucible at one or more defined heights along the longitudinal axis of the crucible; a rotary drive that is operable to cause a rotational movement of the fixing means around the longitudinal axis relative to the heating system.

13 Claims, 6 Drawing Sheets

130
100
120
126
116
118
114
110
128

100
110
120
108
112
106
104
102
118
116
124

Fig. 6
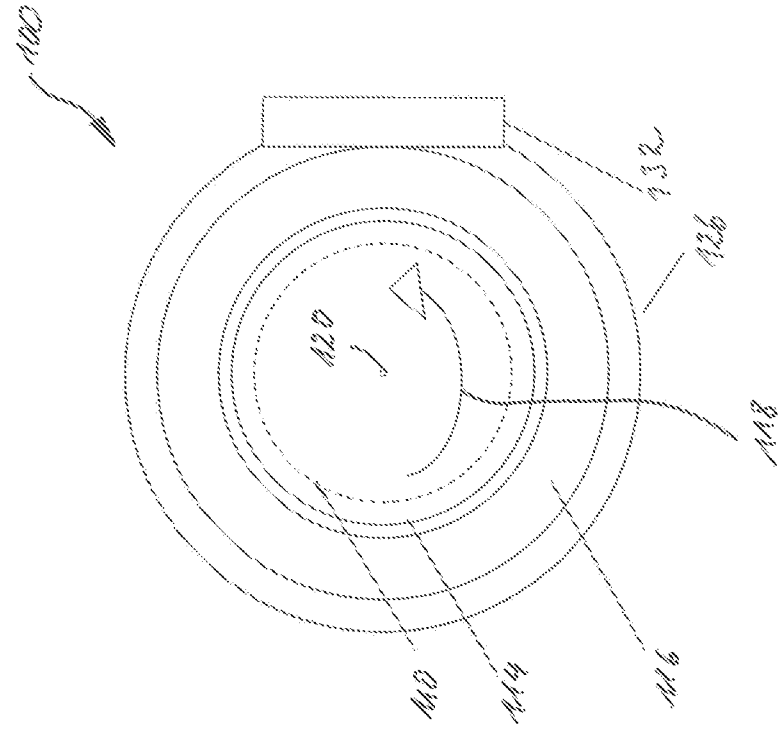

200
236A
208
236B
234
220
210B
218
210A
202
206A
206B
216
224 d_1
806
804
816
814
812
810
800

SYSTEM FOR MANUFACTURING A HIGH-QUALITY SEMICONDUCTOR SINGLE CRYSTAL, AND METHOD OF MANUFACTURING SAME

CROSS-REFERENCE TO RELATED APPLICATION(S)

This application claims priority to European Patent Application No. 23 155 497.3, filed on Feb. 8, 2023, the entire content of which is incorporated herein by reference.

The present invention relates to systems and methods for growing bulk semiconductor single crystals, and more specifically, for growing a bulk semiconductor single crystals, such as silicon carbide, based on physical vapor transport.

Silicon carbide (SiC) is extensively used as a semiconductor substrate material for electronic components in a wide range of applications, such as power electronics, radio frequency, and light emitting semiconductor components.

Physical vapor transport (PVT) is generally used for growing bulk SiC single crystals, and in particular, for commercial purposes. The SiC substrates are produced by cutting slices from the bulk SiC crystal (for e.g. using wire saws) and finishing the slice surface with a sequence of polishing steps. The finished SiC substrates are employed in the manufacturing of semiconductor components, such as in epitaxial processes where thin monocrystalline layers of a suitable semiconductor material (e.g., SiC, GaN) are deposited onto the SiC substrate. The characteristics of the deposited monolayers and the components produced therefrom depend crucially on the quality and homogeneity of the underlying substrate. For this reason, the outstanding physical, chemical, electrical and optical properties of SiC makes it a preferred semiconductor substrate material for power device applications.

PVT is a crystal growing method that essentially involves sublimation of a suitable source material followed by recondensation at a seed crystal, where the formation of the single crystal takes place. The source material and seed crystal are placed inside a growth structure, where the source material is sublimed by heating. The sublimed vapor then diffuses in a controlled manner due to a temperature field having a gradient established between source material and seed crystal and deposits onto the seed to grow as a single crystal.

Conventional PVT-based growth systems generally employ either inductive or resistive heating systems for subliming the source material. In both cases, the core of the PVT-based growth system is the so-called reactor. The growth structure, essentially comprising a crucible and a fixing means for the seed crystal and conventionally made of insulating, graphite and carbon materials, is placed in the interior of the reactor and heated by either induction coils arranged outside the reactor or by resistive heaters arranged outside or inside the reactor. The temperature within the growth structure is measured by one or more pyrometers or by one or more thermocouples installed close to an overture of the growth structure. The vacuum-sealed reactor is evacuated by one or more vacuum pumps and supplied with inert or doping gases via one or more gas feeds to create a controlled gas (gas mixture atmosphere). All process parameters (pressure, temperature, gas flow, etc.) can be adjusted, controlled and stored by a computer-operated system controller, which communicates with all involved components (for e.g. inverter, pyrometer, vacuum control valve, mass flow control (MFC), and pressure gauges).

In the case of inductively-heated PVT systems, the reactor usually includes one or more glass tubes, which are optionally cooled with water and provided at both ends with flanges to seal the interior of the reactor against the atmosphere. An example of such an inductively heated PVT system is described in U.S. Pat. No. 8,865,324 B2. FIG. 8 illustrates such a conventional inductively heated PVT system 800.

The growth arrangement 800 comprises a growing crucible 802, which contains an SiC supply region 804 and a crystal growth region 806. Powdery SiC source material 808, which is poured as a pre-finished starting material before the beginning of the growth process into the SiC supply region 804 of the growing crucible 802, for example, is located in the SiC supply region 804. A seed crystal 810 is provided on an inner wall opposing the SiC supply region 804 of the growing crucible 802, e. g. on its crucible lid 812, in the crystal growth region 806. The bulk SiC single crystal to be grown grows on the seed crystal 810 by deposition from an SiC growth gas phase forming in the crystal growth region 806. The growing bulk SiC single crystal and the seed crystal 810 may have approximately the same diameter.

The growing crucible 802 including the crucible lid 812 may be fabricated from an electrically and thermally conductive graphite crucible material. Around it is arranged a thermal insulation (not shown in the Figure), which may comprise, for example, a foam-like graphite insulation material, the porosity of which is, in particular, higher than that of the graphite crucible material.

The thermally insulated growing crucible 802 is placed inside a tubular container 814, which may be configured as a quartz glass tube and forms an autoclave or reactor. An inductive heating device in the form of a heating coil 816 is arranged around the container 814 to heat the growing crucible 802. The growing crucible 802 is heated by the heating coil 816 to growth temperatures of more than 2000° C., in particular to about 2200° C. The heating coil 816 inductively couples an electric current into an electrically conductive crucible wall (the so-called susceptor) of the growing crucible 802. This electric current flows substantially as a circulating current in the peripheral direction within the circular and hollow cylindrical crucible wall and in the process heat the growing crucible 802. The susceptor can be made from graphite, TaC, WC, Ta, W, or other refractory metals. The primary purpose of the susceptor is to provide a heat source for inside of the crucible 802. When the susceptor is heated with induction, the surface of the susceptor reaches a high temperature, and the temperature is then transferred to the inside of the crucible 802 through conduction and/or radiation.

As mentioned above, the induction coil 816 is mounted outside the glass tube 814 and is usually surrounded by a Faraday cage (not visible in the drawing) forming an electromagnetic shielding to shield the electromagnetic radiation. The induction coil 816 is wound with equidistant windings, each being distanced from the adjacent winding by a distance d_1.

Furthermore, in conventional resistively-heated PVT systems, the heating resistive elements are mounted inside the reactor. In case the reactor is made of metal, it can be cooled by water or air. Examples of resistively-heated PVT systems are described in published patent applications US 2016/0138185 A1 and US 2017/0321345 A1.

At present, these and other conventional PVT growth systems with components similar to those mentioned above are based on the idea to heat up the inside of the crucible with a temperature field that is as homogeneous as possible in a radial direction and providing a defined temperature-gradient in an axial direction, in order to set a driving force for the sublimed gas species moving to the seed and the growing single-crystal.

For the growth of a high-quality crystal, a homogeneous coupling of the heat into the growth crucible in the radial direction is considered as being of enormous importance. By coupling the heat as homogeneously as possible, the crystal should also grow as homogeneously and symmetrically as possible. Among other things, this should prevent the formation of threading screw dislocations (TSD) and threading edge dislocations (TED), also called step dislocations, whose formation is favored by an inhomogeneous, asymmetrical heat distribution and the associated inhomogeneous, asymmetrical growth.

Therefore, every effort is usually made to design a homogeneous and ideally radially symmetrical heat coupling growth system, and according to the state of the art, the construction elements that might influence the induction field are made of materials such as plastic or hard paper or similar composite and construction materials, in order to avoid such influences.

However, the inventors of the present disclosure have found that even in growing systems that couple heat into the crucible in the most homogeneous and ideally radially symmetrical manner, it is not possible to grow crystals of the highest quality, i. e. crystals that are as free as possible from screw and step dislocations.

In the published European patent application EP 3 699 328 A1, a method for improving the quality of the SiC single crystal by using a particularly homogeneous insulation is described. However, the use of optimized isolation is not sufficient to always produce dislocation-free crystals, although the use of a homogeneous isolation already favors a homogeneous and thus low-defect growth.

Furthermore, published European patent application EP 4 060 098 A1 discloses a method for the reduction of screw dislocations, wherein the screw dislocations present in the seed crystal are to be made mobile by the mechanical tensioning of the seed crystal used, so that these can extinguish each other if necessary when they meet. However, this process cannot mobilize dislocations, in particular screw and step dislocations, which are newly formed during crystal growth, for mutual extinction. As a result, it is not possible to grow crystals that are as free as possible from screw and step dislocations.

The present invention has been made in view of the shortcomings and disadvantages of the prior art, and an object thereof is to provide a system for growing single crystals of a semiconductor material by physical vapor transport (PVT) and a method of manufacturing same with improved single crystal quality and in a cost effective manner.

This object is solved by the subject matter of the independent claims. Advantageous embodiments of the present invention are subject matter of the dependent claims.

The present invention is based on the idea that instead of trying to achieve a temperature field during the crystal growth, which is as uniform and rotationally symmetric as possible, it can also be provided that the growing crystal experiences a time variable temperature field. The inventors of the present disclosure have found that such a temporal fluctuation sets any formed screw and/or step dislocations in motion, so that they may encounter and annihilate each other. In particular, since an ideally homogeneous field is obviously not sufficient to obtain the desired crystal quality, the approach presented here is to induce movements of the dislocations by a periodically varying temperature field during growth in such a way that the dislocations may cancel each other out.

In particular, a sublimation system for growing at least one single crystal of a semiconductor material by means of a sublimation growing process is provided, the sublimation system comprising a crucible having a longitudinal axis and comprising a fixing means for at least one seed crystal and at least one source material compartment for containing a source material; a heating system being formed to generate an irregular temperature field around a circumference of the crucible at one or more defined heights along the longitudinal axis of the crucible; and a rotary drive that is operable to cause a rotational movement of the fixing means around the longitudinal axis relative to the heating system.

It should be noted that a distinction has to be made between the radial and the axial temperature field.

The radial field, especially in the region of the growing crystal, should have an inhomogeneity through which the crystal migrates steadily due to the rotational unit. This can also happen in different angular ranges and several heights due to different irregularities of the system.

The axial temperature gradient is primarily the driving force for growth: the seed is colder than (powder) source, so that transport of sublimated Si and C species can occur. However, the axial gradient at the periphery is perturbed by the irregularities of the growth system in the same way as the radial gradient.

Therefore, the two gradients are coupled radially and axially.

Advantageously, the sublimation system has a the heating system which comprises an induction coil operable to generate a magnetic field and/or a resistive heating coil, the coil in any case at least partly surrounding the crucible. Such a coil-shaped heating system, either inductive or resistive, can easily be deformed to provide an asymmetric temperature field in which the growing single crystal is moving.

In case the heating system is based on an inductive coil, the heating system may comprise an electro-magnetic field control element for steering the magnetic field. Such an electro-magnetic field control element may for instance comprise a metallic strut member and/or a pole piece. Thereby the irregularity can be created in a particularly easy manner without having to interfere with the coil itself.

On the other hand, the heating system may also comprise a coil which has a deformed cross-section in at least one of its windings, and/or a coil with at least one winding, which is arranged to have a different distance from its neighboring windings. In other words, a part of the coil is either deformed in its cross-section or is shifted in an axial direction with respect to the remaining equidistant turns. This allows for a particularly well-defined manner of creating an irregular temperature field.

A particularly easy way of introducing an irregularity into the temperature field can be achieved if the coil comprises at least one electrical contact, which is arranged at an axial position adjacent to the crucible instead of being arranged at a peripheral end of the sublimation system.

In order to provide the rotation necessary for causing the seed crystal and the growing crystal to periodically move through the asymmetric temperature field, various possibilities exist, which may be used according to the respective structural conditions of the sublimation system. The rotary drive may be coupled to the fixing means so that the seed crystal and the growing single crystal are rotatable with respect to the crucible and/or rotary drive may be coupled to the crucible, so that the crucible together with the seed crystal and the growing single crystal is rotatable with respect to the heating system.

In case the sublimation system comprises a thermal insulation element, the rotary drive may also be coupled to the thermal insulation element and to the crucible, so that the thermal insulation element and the crucible are rotatable with respect to the heating system. Any other combination of moveable vs. fixed components is of course also usable as long as the seed crystal moves with respect to the radially asymmetric temperature field.

Advantageously, the rotary drive is operable to cause a rotational speed in a range between 1 rpm and 60 rpm, preferably of 10 rpm. It could be shown that these velocities yield best results.

The present disclosure further provides a method of growing at least one single crystal of a semiconductor material by means of a sublimation growing process, the method comprising:

- providing a crucible having a longitudinal axis, fixing at least one seed crystal at a fixing means of the crucible, and filling a source material into at least one source material compartment;
- generating, by means of a heating system, an irregular temperature field around a circumference of the crucible and along the longitudinal axis of the crucible;
- causing a rotational movement of the fixing means around the longitudinal axis relative to the heating system, so that the growing single crystal is exposed to a time variant temperature field.

As mentioned above, the terms “asymmetric” or “irregular” temperature field signify that differing axial temperature gradients around the circumference are correlated to differing radial temperature gradients.

According to an advantageous example, a thermal insulator unit is provided between the crucible and the heating system, wherein the fixing means is rotated in relation to the thermal insulator unit.

The crucible may also be rotated in relation to the heating system and/or in relation to a thermal insulator unit provided between the crucible and the heating system.

According to an advantageous example, a thermal insulator unit is provided between the crucible and the heating system, and the crucible and the thermal insulator unit are rotated in relation to the heating system.

As mentioned above, the rotational movement may be performed with a rotational speed in a range between 1 rpm and 60 rpm, preferably of 10 rpm.

Advantageously, the generated temperature field has regions which differ from each other by at least 2 K and not more than 15 K, and preferably differ by 5 K from each other.

In particular the combination of a 5 K temperature difference and a velocity of 10 rpm results in ideal conditions for mobilizing screw and step dislocations.

Through the deliberate introduction of asymmetries into the growth system in combination with a rotation device, dislocations, namely TSD and TED, are mobilized and, under suitable conditions, can cancel each other out when they meet. This reduces the overall dislocation budget and improves the quality of the grown single crystal.

The accompanying drawings are incorporated into the specification and form a part of the specification to illustrate several embodiments of the present invention. These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form-individually or in different combinations-solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements, and wherein:

FIG. 6 is a schematic top view of a sublimation system according to a further example;

The present invention will now be explained in more detail with reference to the Figures and firstly referring to FIG. 1.

Figure 1:
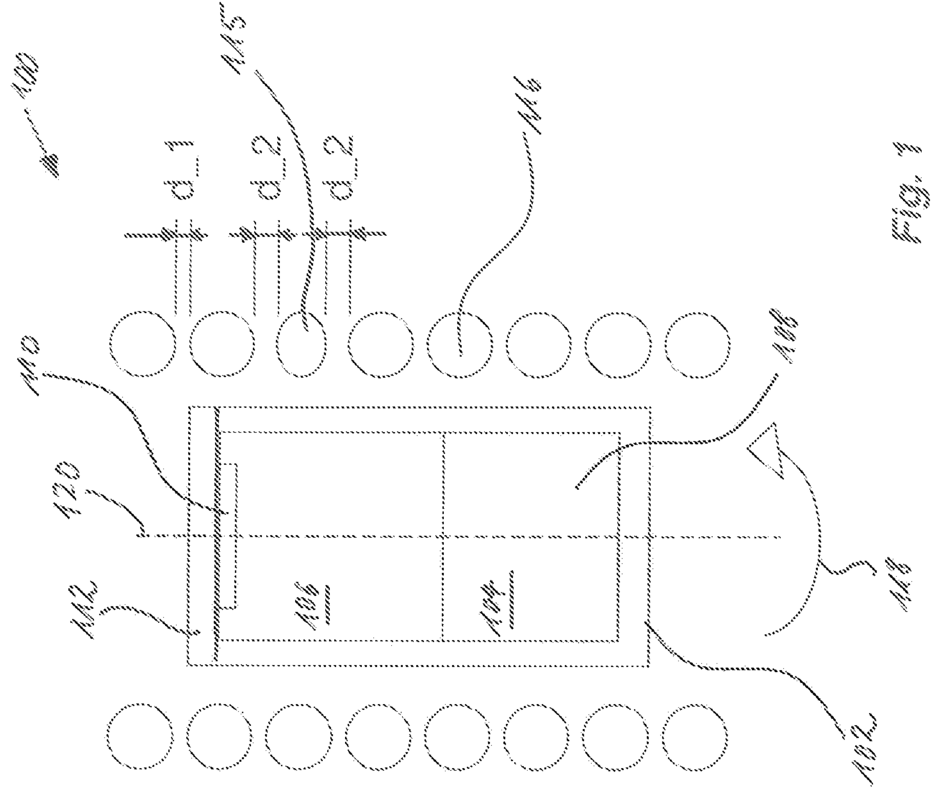
FIG. 1 is a schematic sectional side view of a sublimation system according to a first example.
Figure 8:
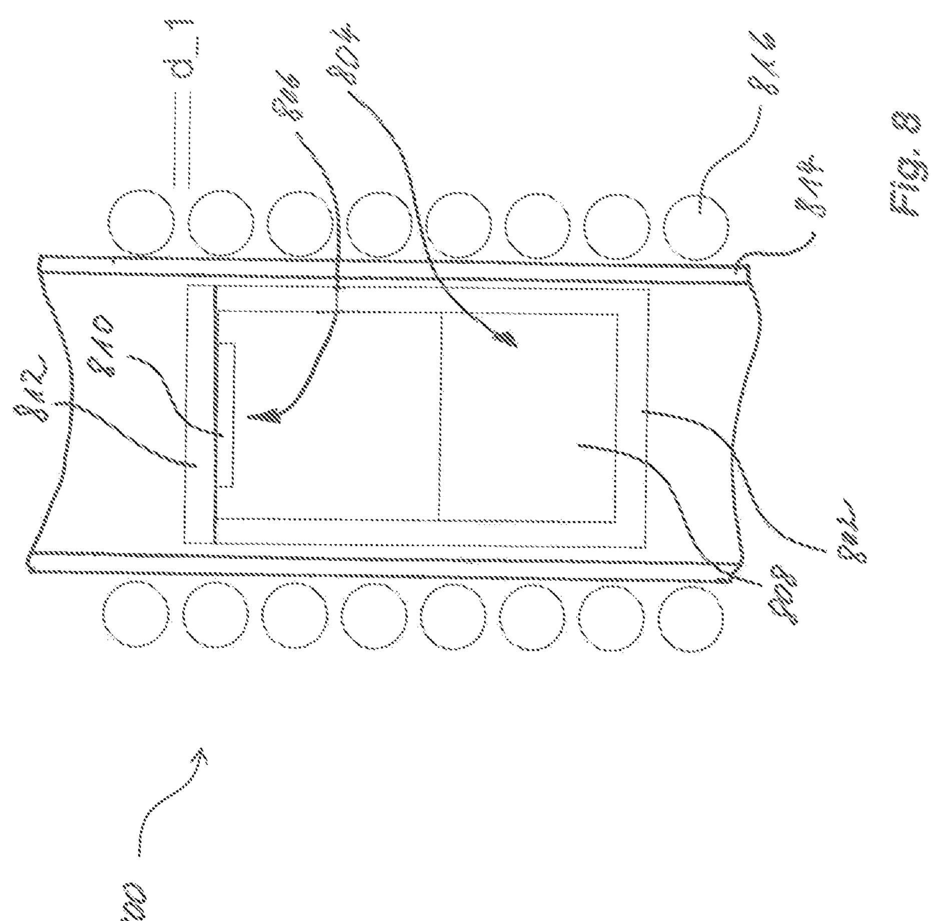
FIG. 8 is a schematic sectional side view of a known sublimation system.

FIG. 1 shows a sublimation system 100 according to a first example of the present disclosure. It should be noted that the term sublimation system is intended to cover any system for growing at least one single crystal of a semiconductor material by means of a sublimation growing process. Preferably, the term refers to a physical vapor transport (PVT) system for growing silicon carbide (SiC) volume single crystals as described with reference to FIG. 8.

The sublimation system 100 comprises a growing crucible 102, which contains a source material compartment, in particular an SiC supply region 104 and a crystal growth region 106. Powdery SiC source material 108, which is poured as a pre-finished starting material before the beginning of the growth process into the SiC supply region 104 of the growing crucible 102, for example, is located in the SiC supply region 104. The source material 108 may also be densified or be at least partly consist of solid material in order to enhance the density of the source material 108.

A seed crystal 110 is provided on an inner wall opposing the SiC supply region 104 of the growing crucible 102, for instance on its crucible lid 112, in the crystal growth region 106. The bulk SiC single crystal to be grown grows on the seed crystal 110 by deposition from an SiC growth gas phase forming in the crystal growth region 106. The growing bulk SiC single crystal and the seed crystal 110 may have approximately the same diameter. The bulk SiC single crystal may also have a larger diameter than the seed crystal 110, if the diameter of the crystal channel is larger than the seed crystal 110. However, the usable low-defect diameter of the grown bulk SiC single crystal usually is the same size as the diameter of the seed crystal.

The growing crucible 102 including the crucible lid 112 may be fabricated from an electrically and thermally conductive graphite crucible material. Around it is arranged a thermal insulation (not shown in the Figure), which may comprise, for example, a foam-like graphite insulation material, the porosity of which is, in particular, higher than that of the graphite crucible material.

In case of an inductive heating, the thermally insulated growing crucible 102 is placed inside a tubular container (not shown in FIG. 1), which may be configured as a quartz glass tube and forms an autoclave or reactor. An inductive heating device in the form of a heating coil 116 is arranged around the container to heat the growing crucible 102. The heating coil 116 generates the required temperature field by inductively coupling an electric current into an electrically conductive crucible wall (the susceptor) of the growing crucible 102. This electric current flows substantially as a circulating current in the peripheral direction within the circular and hollow cylindrical crucible wall and in the process heat the growing crucible 102. The susceptor can be made from graphite, TaC, WC, Ta, W, or other refractory metals, and may either be an integral part of the crucible 102 or may be a separate part close to the crucible wall. The primary purpose of the susceptor is to provide a heat source for inside of the crucible 102. When the susceptor is heated with induction, the surface of the susceptor reaches a high temperature, and the temperature is then transferred to the inside of the crucible 102 through conduction and/or radiation.

As mentioned above, the coil 116 is mounted outside the glass tube in case of an inductive heating and is usually surrounded by a Faraday cage (not visible in FIG. 1) to shield the electromagnetic radiation. In case of a resistive heating, the coil 116 is mounted within the reactor and also within the thermal insulation, thus being in close contact to the crucible 102. The principles of the present disclosure are applicable to both heating techniques. Thus, the coil 116 will more generally be referred to as a heating means and encompasses inductive as well as resistive heating (or a combination thereof) in the following. Furthermore, it should be noted that in the present disclosure the coil windings are depicted as having a rounded, specifically a circular or elliptic cross-section. However, the coil windings may have any other suitable cross-section, such as quadratic or rectangular, as well.

As shown in FIG. 1, the coil 116 has at least one deformed region 115, in which the cross-section of the coil 116 deviates from the circular cross-section of the remaining windings. In FIG. 1, this deviation is depicted as a compression leading to an elliptical cross-section in the deformed region 115. Of course, also other cross-sectional irregularities may be applied to the coil 116. In the deformed region 115, the distance between the deformed winding to the adjacent windings is enlarged to a distance d_2 compared to the regular distance d_1 between the undeformed remaining windings.

In operation, the constructional asymmetry due to this deformed region 115, which may cover e. g. 10° to 90° of the circumference, preferably 10° to 45°, causes an irregularity in the temperature field. This irregularity extends in a radial direction (around the circumference of the crucible) as well as in an axial direction (along the center axis 120).

According to the present disclosure, the sublimation system further comprises a rotary drive (not shown in the Figures), which causes a rotational movement as symbolized by the arrow 118 of the seed crystal 110 around the central axis 120, while the heating means 116 is generating a spatially varying temperature field. The direction of rotation is of course arbitrary.

The rotational movement of the seed crystal with the growing single crystal within a spatially inhomogeneous temperature field achieves the effect that the seed crystal with the growing single crystal experiences a time variant, in other words oscillating, temperature field. These dynamic variations of the temperature field acting on the growing crystal set the screw and step dislocations inside the growing single crystal in motion so that they have the opportunity of encountering and annihilating each other.

In other words, the growing crystal is subjected to a periodic temperature cycling due to the combination of a structurally asymmetric growth system with a rotational movement of the growing crystal in relation to the temperature field.

It could be shown that the temperature measured at two points at a certain height of the growing crystal, which have the same radial distance from the seed crystal's 110 rotational axis, has to differ by at least 2 K and by maximal 15 K, in order to mobilize the screw and step dislocations. Preferably, the temperature should differ by 5 K.

The axial position of the temperature irregularity can either correspond to the current growth/gas phase boundary or lie anywhere between the seed crystal 110 and the current growth/gas phase boundary. This means that the periodic temperature cycling can act on the very surface of the growing crystal or in a deeper region to mobilize just created or earlier created screw and/or edge dislocations.

The radial distance can correspond to the final diameter of the substrates machined from the grown crystal, but is not limited to this correspondence. The diameter can also be larger or smaller than the corresponding radius of the resulting SiC-substrate.

The growing crystal can also be exposed to a variety of local maximum and minimum temperatures, as the structurally asymmetric growth system can have multiple asymmetries and irregularities in the resulting temperature field along its longitudinal axis each with a radial spreading from 10° to 90°, preferably from 10° to 45° of the circumference.

For instance for a substrate diameter of 150 mm (i. e. a radius of 75 mm), the size of a temperature irregularity may correspond to the radial spreading from 10° to 90° and can thus be 1.3 cm up to 11.8 cm, preferably from 10° to 45° thus up to 5.9 cm. These values are calculated using the radius of r=7.5 cm in the below formula for the circular arc L:

$$L = [\alpha \cdot \pi \cdot r]/180$$

wherein α is the value of the angle in degrees.

Accordingly, for a diameter of 200 mm, the respective values may be adapted using a radius r=10.0 cm.

Furthermore, an optimal mobilization of the screw and step dislocations can be achieved when rotating the seed crystal with the growing single crystal in relation to the heating means at a rotational speed in a range of 1 rpm (revolutions per minute) to 60 rpm, preferably at 10 rpm.

The rotation according to the present disclosure can mechanically be provided by attaching a rotary drive to various components of the sublimation system 100, as long as the inhomogeneous temperature field moves with respect to the growing single crystal. For instance, the fixture of the seed crystal 110 can be rotated with respect to the heating coil 116 and with a static insulation. Further, the crucible 102 can be rotated, while the heating coil and the insulation are static. Moreover, the crucible and the insulation can be rotated with respect to the heating coil 116, with the heating coil being stationary. Any suitable combinations for rotation of multiple elements may also be applied.

Figure 2:
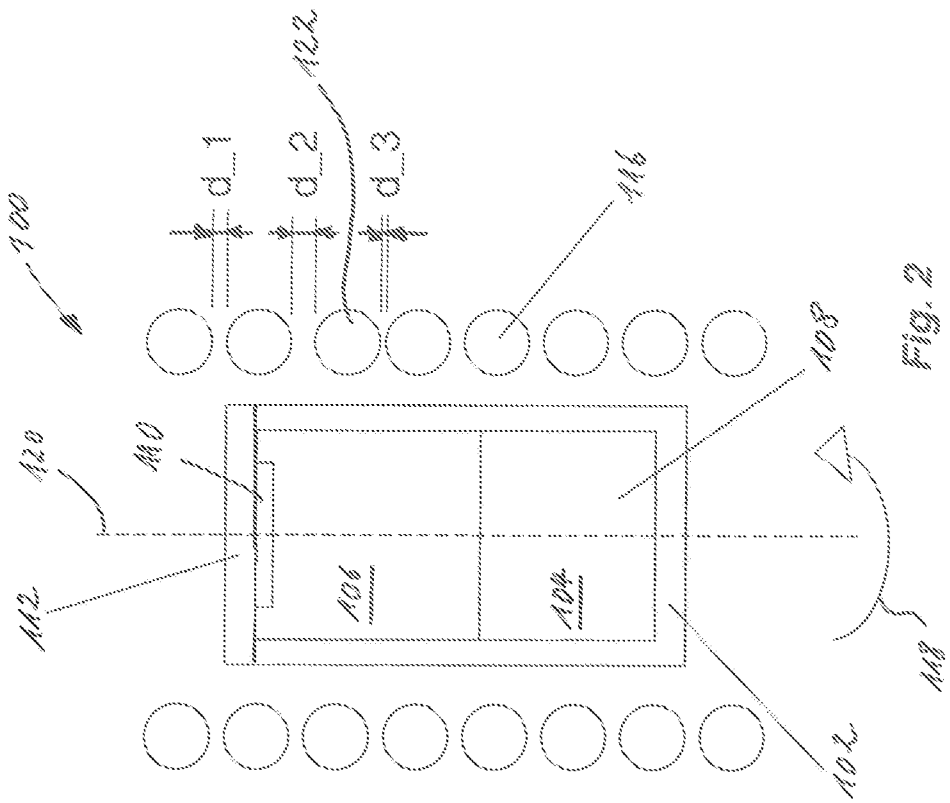
FIG. 2 is a schematic sectional side view of a sublimation system according to a further example.

FIG. 2 shows a different example of how the rotational symmetry of the heating means 116 may be disrupted in order to create a non-uniform temperature field. It should be noted that the remaining features of the sublimation system 100 correspond to those of the sublimation system 100 shown in FIG. 1.

According to FIG. 2, the heating means comprises a heating coil 116, which has an essentially uniform cross-section over all its turns, but has at least one turn which is in a part of the circumference displaced axially (i. e. along the center axis 120). Thus, while all the remaining turns have a uniform distance d_1 from each other, a displaced region 122 of the coil 116 has a reduced distance d_3 (smaller than d_1) to the closer adjacent turn and an enhanced distance d_2 (larger than d_1) to the further adjacent turn. By this deliberate asymmetry a non-uniform temperature field is generated, which together with the rotational movement explained above with reference to FIG. 1 leads to a dynamic temperature field being experienced by the growing crystal in the crystal growth region 106.

It should be noted that along the circumference of the coil 116 the transition from the regular distance d_1 to the fully displaced (maximum) values d_2 and d_3, respectively, may be a gradual transition. However, of course also a step-shaped displacement may be provided by applying respective sharp bends. Again, the irregularity of the coil may be provided along 10° to 90°, preferably 10° to 45° of the full 360° circumference of the coil 116.

The rotation is then performed as mentioned above with respect to FIG. 1.

Figure 3:
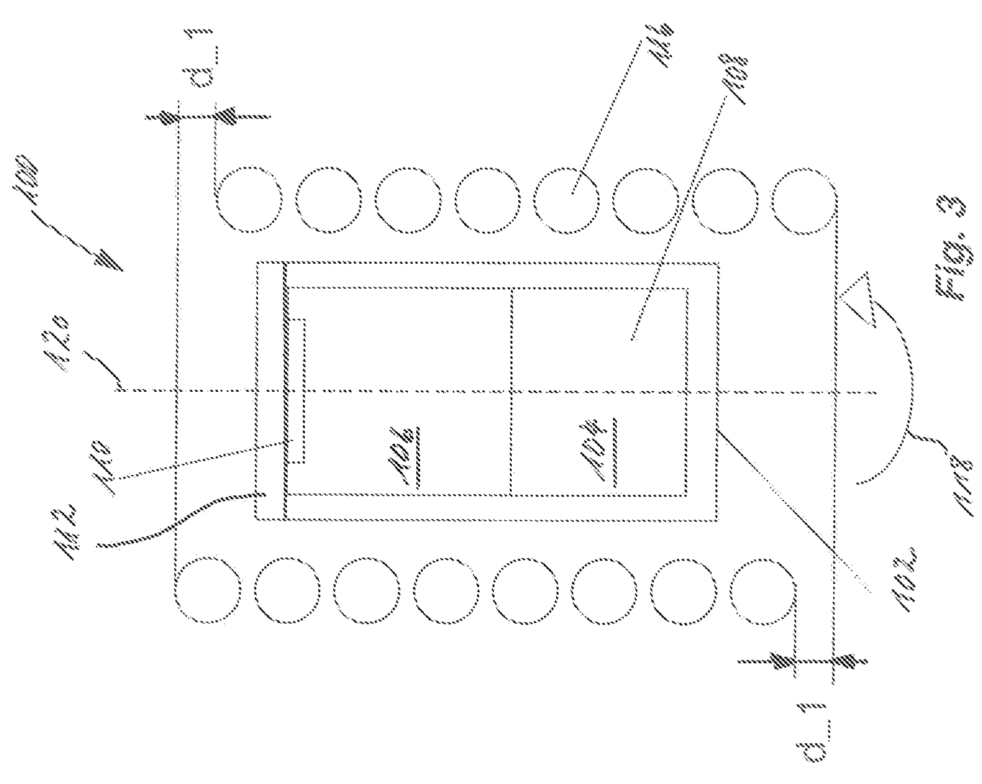
FIG. 3 is a schematic sectional side view of a sublimation system according to a further example.

FIG. 3 shows another example of how the rotational symmetry of the heating means 116 may be disrupted in order to create a non-uniform temperature field. It should be noted that the remaining features of the sublimation system 100 correspond to those of sublimation system 100 shown in FIG. 1.

According to the example shown in FIG. 3, all the windings of the coil 116 are shifted along the central axis 120 to have an increased slope. Thus, two opposing regions of each winding are axially offset for instance by a distance d_1. The result is a rotationally asymmetric temperature field through which the growing single crystal is travelling periodically by a rotation according to any of the configurations mentioned regarding the example of FIG. 1.

Figures 4, 5:
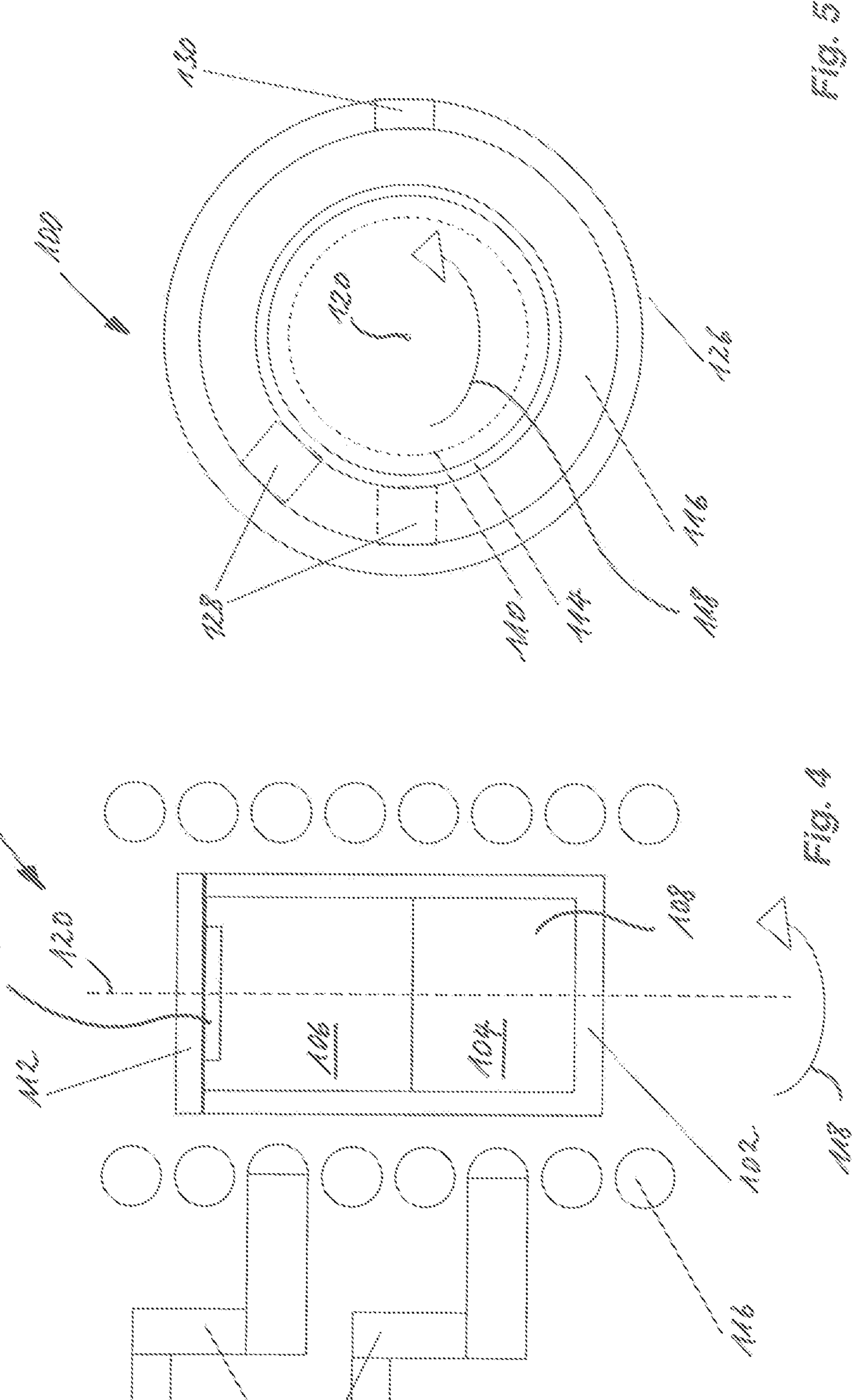
FIG. 4 is a schematic sectional side view of a sublimation system according to a further example.
FIG. 5 is a schematic top view of a sublimation system according to a further example.

Furthermore, a deliberate constructional asymmetry can also be introduced into the sublimation system 100 by arranging the electrical contacts 124 of the heating coil 116 in an area surrounding the crucible 102. This example is shown in FIG. 4. At least one of the current feeding electrical contacts 124 is located not at a peripheral end of the heating coil 116, but is axially moved into a region where they constitute a structural asymmetry close to the crucible 102 and in particular, close to the crystal growth region 106. Thus, in operation the heating coil 116 generates a non-uniform temperature field, through which the growing single crystal is rotated. This rotation leads to a pulsating temperature field the growing single crystal and mobilizes step and screw dislocations. The moving step and screw dislocations have the chance to encounter and annihilate each other, thereby significantly improving the overall quality of the grown single crystal boules.

FIG. 5 shows a top view of a sublimation system 100 according to a further example of the present disclosure. In this Figure, the heating coil 116 is arranged inside a shielding 126 which shields the outside environment from electromagnetic radiation. The coil 116 surrounds the reactor 114 with the seed crystal 110 inside.

According to this advantageous example, one or more first pole shoes 128 (also referred to as pole pieces) are arranged along the coil's windings at one or more different positions (and axial heights). These pole shoes 128 function as guiding elements for the electromagnetic field generated by the coil 116. Thus, a deliberate asymmetry is introduced into the resulting temperature field. As mentioned with reference to the previous examples, the sublimation system 100 further comprises a rotary drive (not shown in the Figures), which causes a rotational movement as symbolized by the arrow 118 of the seed crystal 110 around the central axis 120, while the heating means 116 is generating a spatially varying temperature field. The direction of rotation is of course arbitrary.

The rotational movement 118 of the seed crystal 110 with the growing single crystal within the spatially inhomogeneous temperature field achieves the effect that the seed crystal 110 with the growing single crystal experiences a time variant, in other words oscillating, temperature field. These dynamic variations set the screw and step dislocations inside the growing single crystal in motion so that they have the opportunity of encountering and annihilating each other.

In other words, the growing crystal is subjected to a periodic temperature cycling due to the combination of a structurally asymmetric growth system with a rotational movement of the growing crystal in relation to the temperature field.

The rotation according to the present disclosure can mechanically be provided by attaching a rotary drive to various components, as long as the inhomogeneous temperature field moves with respect to the growing single crystal. For instance, the fixture of the seed crystal 110 can be rotated with respect to the heating coil 116 and with a static insulation. Further, the crucible 102 can be rotated, while the heating coil and the insulation are static. Moreover, the crucible and the insulation can be rotated with respect to the heating coil 116, with the heating coil being stationary. Any suitable combinations for rotation of multiple elements may also be applied.

Additionally or alternatively, a second pole shoe 130 may be provided at the electromagnetic shielding 126, extending into a gap between the shielding 126 and the coil 116. Again, this pole shoe 130 constitutes a structural asymmetry close to the crucible 102 and in particular, close to the crystal growth region 106. Thus, in operation the heating coil 116 generates a non-uniform temperature field, through which the growing single crystal is rotated. This rotation leads to a pulsating temperature field the growing single crystal and mobilizes step and screw dislocations. The moving step and screw dislocations have the chance to encounter and annihilate each other, thereby significantly improving the overall quality of the grown single crystal boules.

FIG. 6 shows in a top view a sublimation system 100 according to a further advantageous example. As shown in this Figure, the asymmetry of the temperature field may also be caused by an asymmetric shielding 126 and a metallic holder 132 of the shielding 126. The holder 132 may advantageously extend into the gap between the coil 116 and the shielding 126.

Thus, in operation the heating coil 116 generates a non-uniform temperature field, through which the growing single crystal is rotated as indicated by the arrow 118. Thus, any screw and step dislocations in the growing single crystal are mobilized, so that they may encounter and annihilate each other.

Figure 7:
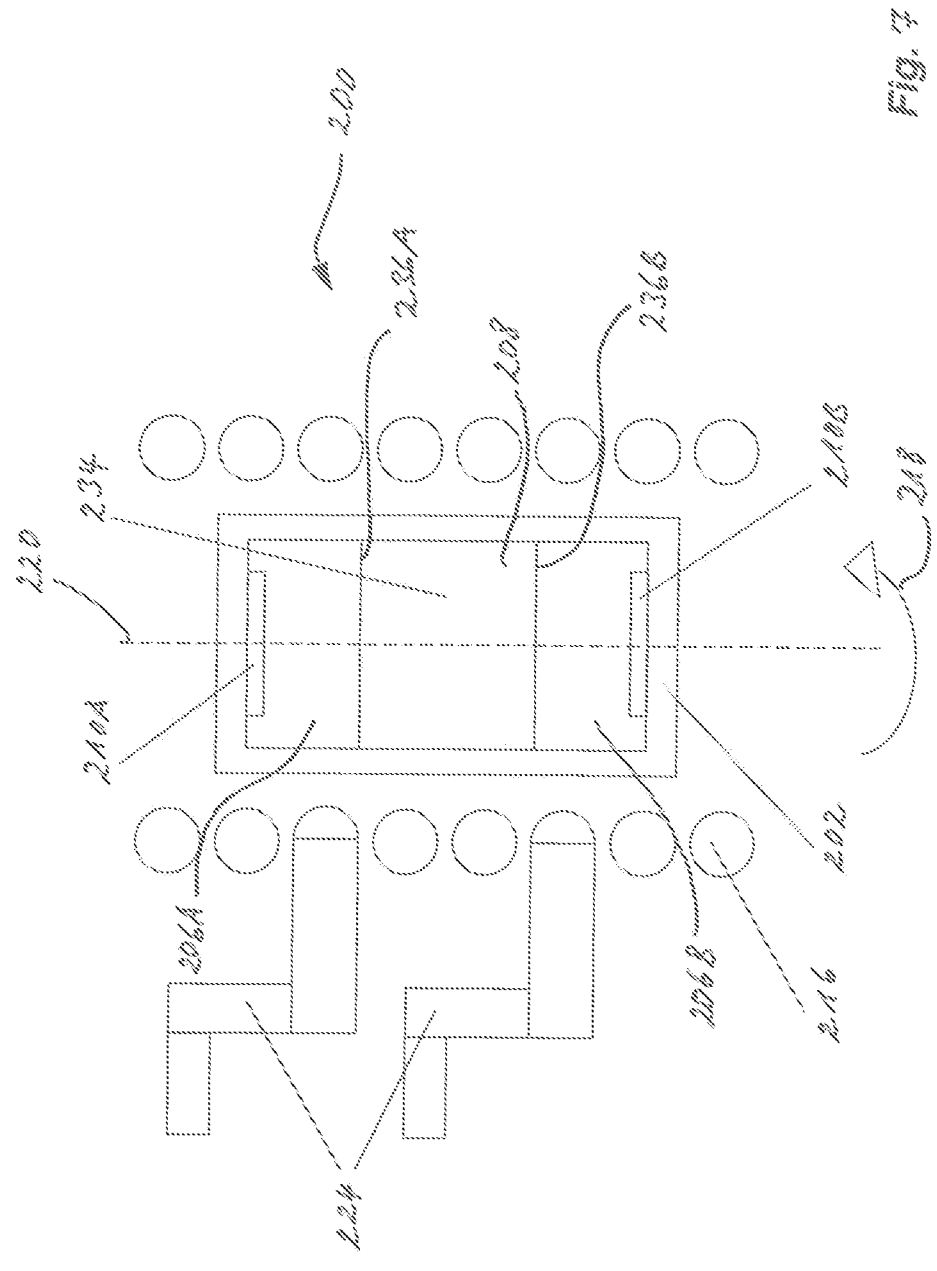
FIG. 7 is a schematic sectional side view of a sublimation system according to a further example.

Now turning to FIG. 7, the principles of the present disclosure may further be applied to a sublimation system

200, which is operable to grow two single crystal boules simultaneously. To this end, the crucible 202 comprises a first seed crystal 210A and a second seed crystal 210B. FIG. 7 shows the example analogous to the arrangement shown in FIG. 4. However, it is clear that any of the other possibilities to generate an asymmetric temperature field may also be applied to a sublimation system 200 for simultaneously growing more the one single crystal boule as for instance described in the European patent EP 2 664 695 B1.

In particular, FIG. 7 shows a schematic cross sectional view of a physical vapor transport (PVT) growth system 200 for simultaneously growing two SiC bulk crystals. The system 200 comprises a crucible 202 which contains a central source material compartment 234 containing SiC powder 208 as the SiC source material.

The two seed crystals 210A and 210B are arranged in growth regions 206A and 206B. Each of the growth regions 206A and 206B is separated from the powderous, compacted, or solid SiC source material 208 by means of a gas permeable porous barrier 236A, 236B. Thus, it is ensured that only gaseous Si and C containing components enter the growth regions 206A and 206B. A heating coil 216 provides the necessary temperature field. The asymmetry of the temperature field is achieved by providing electrical contacts 224 in the vicinity of the crystal growth regions 206 A, 206B.

Both seed crystals 210A, 210B are rotated within the asymmetric temperature field generated by the coil 216 in order to mobilize step and/or screw dislocations within the growing single crystals as mentioned above with reference to FIGS. 1 to 6.

In summary, the present disclosure is based on the idea that instead of trying to achieve a temperature field during the crystal growth, which is as uniform and rotationally symmetric as possible, it can also be provided that the growing crystal experiences a time variable temperature field. The inventors of the present disclosure have found that such a temporal fluctuation sets any formed screw and/or step dislocations in motion, so that they may encounter and annihilate each other. In particular, since an ideally homogeneous field is obviously not sufficient to obtain the desired crystal quality, the approach presented here is to induce movements of the dislocations by a periodically varying temperature field during growth in such a way that the dislocations may cancel each other out.

For this purpose, several conditions must be met: The solution to the technical problem of growing crystals that are almost free of screw and step dislocations lies, on the one hand, in the design of a growth system that deliberately causes an inhomogeneous and radially asymmetric heat coupling into the growth crucible.

Such an inhomogeneous, asymmetric heat coupling may for instance be achieved by the following features of the crystal growth system:

- Non-equidistant spacing of coil turns due to non-uniform alignment
- Non-equidistant spacing of coil turns due to non-uniform construction of the turns
- Inlet and outlet to the coil/resistance heater in the area of the susceptor and the growth crucible
- Winding ends of the coil (in the area of the susceptor and the growth crucible)
- Insertion of one or more induction field guides, e. g. at least one metallic strut, pole shoe, or the like; the electrically conductive components can be attached either directly to the induction coil or between the induction coil and the electromagnetic shield
- Use of asymmetrical shielding of the electromagnetic field On the other hand, the solution to the technical problem of growing crystals that are almost free of screw and/or step dislocations lies in the installation of a rotation device in the inhomogeneously heat-coupling growth system.

Rotation can initiate dislocation dynamics in the following configurations:

- Rotation of the seed with static insulation/coil/resistance heating
- Rotation of the crucible with static insulation/coil/resistance heating
- Rotation of the crucible and insulation with static coil/resistance heating
- Combinations for rotation of multiple elements It is through the combination of the rotation device and the asymmetric growth system according to the invention that a dynamic process is initiated which mobilizes the screw and step dislocations. This mobilization makes it possible for the dislocations to meet and cancel each other out.

The growing crystal passes through areas of lower and higher temperature in a recurring manner (sinusoidal) due to the rotation, which results from the special design of the crystal growing system and the resulting asymmetric heat coupling.

To mobilize the dislocations, the temperature, measured at two points on the diameter of the substrate diameter to be prepared from the crystal, must differ by at least 2 K and at most by 15 K, preferably by 5 K. The rotation frequency should be between 1 and 60 revolutions per minute (rpm), preferably 10 rpm, for optimal mobilization of the dislocations. This combination of 5 K temperature difference and 10 rpm results in ideal conditions for mobilizing screw and step dislocations.

Through the deliberate introduction of asymmetries into the growth system in combination with a rotation device, dislocations, namely TSD and TED, are mobilized and, under suitable conditions, can cancel each other out when they meet. This reduces the overall dislocation budget and improves the quality of the grown single crystal.

REFERENCE NUMERALS

| Reference Numeral | Description |
|---|---|
| 100; 200 | sublimation system; PVT system |
| 102; 202 | crucible |
| 104 | SiC supply region; source material compartment |
| 106; 206A, 206B | crystal growth region |
| 108; 208 | source material |
| 110; 210A, 210B | seed crystal |
| 112 | crucible lid |
| 114 | container; reactor |
| 115 | deformed region |
| 116; 216 | inductive or resistive heating coil; heating means |
| 118; 218 | rotational movement |
| 120; 220 | central axis |
| 122 | displaced region |
| 124; 224 | electrical contact |
| 126 | shielding |
| 128 | first pole shoe |
| 130 | second pole shoe |
| 132 | holder |
| 234 | source material compartment |
| 236A, 236B | barrier |
| 800 | PVT system |
| 802 | crucible |
| 804 | SiC supply region |
| 806 | crystal growth region |

-continued

REFERENCE NUMERALS

| Reference Numeral | Description |
| --- | --- |
| 808 | source material |
| 810 | seed crystal |
| 812 | crucible lid |
| 814 | container; reactor |
| 816 | inductive heating coil |

The invention claimed is:

1. Sublimation system for growing at least one single crystal of a semiconductor material by means of a sublimation growing process, the sublimation system (100) comprising:
   - a crucible (102) having a longitudinal axis (120) and comprising a fixing means for at least one seed crystal (110) and at least one source material compartment (104) for containing a source material (108);
   - a heating system being formed to generate an irregular temperature field around a circumference of the crucible at one or more defined heights along the longitudinal axis of the crucible;
   - a rotary drive that is operable to cause a rotational movement of the fixing means around the longitudinal axis relative to the heating system; and
   - a thermal insulation element between the crucible (102) and the heating system;
   - wherein the rotary drive is coupled to the thermal insulation element and to the crucible (102), so that the thermal insulation element and the crucible (102) are rotatable with respect to the heating system.

2. Sublimation system according to claim 1, wherein the heating system comprises an induction coil (116) operable to generate an electro-magnetic field and/or a resistive heating coil (116), at least partly surrounding the crucible (102).

3. Sublimation system according to claim 2, wherein the heating system comprises an electro-magnetic field control element for steering the electro-magnetic field.

4. Sublimation system according to claim 3, wherein the electro-magnetic field control element comprises a metallic strut member and/or a pole piece.

5. Sublimation system according to claim 2, wherein the coil (116) has a deformed cross-section in at least one of its windings, and/or wherein the coil (116) has at least one winding, which is arranged to have a different distance from its neighboring windings.

6. Sublimation system according to claim 2, wherein the coil (116) comprises at least one electrical contact (124), which is arranged at an axial position adjacent to the crucible (102).

7. Sublimation system according to claim 1, wherein the rotary drive is coupled to the fixing means so that the at least one seed crystal (110) is rotatable with respect to the crucible (102).

8. Sublimation system according to claim 1, wherein the rotary drive is operable to cause a rotational speed in a range between 1 rpm and 60 rpm, or a rotational speed of 10 rpm.

9. Method of growing at least one single crystal of a semiconductor material by means of a sublimation growing process, the method comprising:
   - providing a crucible (102) having a longitudinal axis, fixing at least one seed crystal (110) at a fixing means of the crucible, and filling a source material (108) into at least one source material compartment (104);
   - generating, by means of a heating system, an irregular temperature field around a circumference of the crucible (102) and along the longitudinal axis of the crucible (102); and
   - causing a rotational movement of the fixing means around the longitudinal axis relative to the heating system, so that the growing single crystal is exposed to a time variant temperature field;
   - wherein a thermal insulator unit is provided between the crucible (102) and the heating system, and
   - wherein the crucible (102) and the thermal insulator unit are rotated in relation to the heating system.

10. Method according to claim 9, wherein the fixing means is rotated in relation to the thermal insulator unit.

11. Method according to claim 9, wherein the crucible is rotated in relation to the heating system and/or in relation to the thermal insulator unit provided between the crucible and the heating system.

12. Method according to claim 9, wherein the rotational movement is performed with a rotational speed in a range between 1 rpm and 60 rpm, or with a rotational speed of 10 rpm.

13. Method according to claim 9, wherein the generated irregular temperature field has regions which differ from each other by at least 2 K and not more than 15 K, or which differ by 5 K from each other.

* * * * *